(12) United States Patent
Blanton et al.

(10) Patent No.: US 6,620,456 B2
(45) Date of Patent: Sep. 16, 2003

(54) FORMING A DIELECTRIC LAYER BY THERMAL DECOMPOSITION OF A METALLO-ORGANIC MATERIAL

(75) Inventors: Thomas N. Blanton, Rochester, NY (US); Dilip K. Chatterjee, Rochester, NY (US); Donn B. Carlton, Hamlin, NY (US)

(73) Assignee: Eastman Kodak Company, Rochester, NY (US)

( * ) Notice: Subject to any disclaimer, the term of this patent is extended or adjusted under 35 U.S.C. 154(b) by 83 days.

(21) Appl. No.: 09/793,299

(22) Filed: Feb. 26, 2001

(65) Prior Publication Data

US 2002/0151439 A1 Oct. 17, 2002

(51) Int. Cl.⁷ ................................................. B05D 3/02
(52) U.S. Cl. ..................................... 427/226; 427/126.3
(58) Field of Search .............................. 427/126.3, 226, 427/255.19, 255.36

(56) References Cited

U.S. PATENT DOCUMENTS

| | | | |
|---|---|---|---|
| 4,520,114 A | * | 5/1985 | David ........................... 501/12 |
| 4,880,770 A | | 11/1989 | Mir et al. |
| 4,963,390 A | * | 10/1990 | Lipeles et al. ............... 427/110 |
| 5,472,795 A | * | 12/1995 | Atita ........................... 428/660 |
| 5,889,234 A | | 3/1999 | Ghosh et al. |
| 2001/0011743 A1 | * | 8/2001 | Arita et al. .................. 257/314 |

OTHER PUBLICATIONS

Cullity, Elements of X–Ray Diffraction, Addison–Wesley, Reading, Mass, No month available 1978 p. 102.

Garvie et al, Phase Analysis in Zirconia Systems, Journal of American Ceramic Society, vol. 55, Issue 6, Jun. 1972, pp. 303–305.

* cited by examiner

Primary Examiner—Brian K. Talbot
(74) Attorney, Agent, or Firm—Raymond L. Owens

(57) ABSTRACT

A method of forming a dielectric layer on a substrate, including the steps of providing a metallo-organic material in a solvent, which dissolves such metallo-organic material; coating dissolved metallo-organic material onto the substrate to form a layer; and heating the deposited layer in an oxygen environment to produce thermal decomposition of the organic component of the dissolved metallo-organic material and a reaction of the metallic portion of the material with oxygen thereby causing the layer to become dielectric.

4 Claims, 6 Drawing Sheets

FORMING A DIELECTRIC LAYER BY THERMAL DECOMPOSITION OF A METALLO-ORGANIC MATERIAL

CROSS REFERENCE TO RELATED APPLICATION

Reference is made to commonly-assigned U.S. patent application Ser. No. 09/792,913 filed Feb. 26, 2001, entitled "A Charge Containing Element" by Chatterjee et al, the disclosure of which is incorporated herein.

FIELD OF THE INVENTION

The present invention relates to forming a dielectric layer by thermal decomposition of a metallo-organic material.

BACKGROUND OF THE INVENTION

Ceramic oxide layers are diverse in their properties. Apart from their unusually high mechanical strength, high wear and abrasion resistance, and high corrosion resistance, they can be considered to be dielectric, ferroelectric, piezoelectric, or optoelectronic materials. They can also be utilized in both electrical and thermal insulation applications. These ceramic oxides can be crystalline or amorphous.

Layers of ceramic materials can be manufactured using physical vapor deposition (PVD) and chemical vapor deposition (CVD), laser ablation, dip and knife coating of a ceramic precursor material, and metallo-oxide decomposition (MOD) as shown by Mir et al in commonly-assigned U.S. Pat. No. 4,880,770.

Formation of dielectric material normally requires high temperature processing. This high temperature processing restricts the choice of substrates that can be selected for use. Capacitors are multilayer coatings comprised of an arrangement of conductive, dielectric, and conductive layers in sequence. There is a need for forming dielectric materials on a substrate in many applications such as capacitive devices. Capacitors are essentially materials with high dielectric constants. Dielectric (which is essentially electrically non-conducting) characteristic of ceramic materials are well known and getting increasing importance as the field of solid state electronics continues to expand rapidly. The principal applications for ceramic dielectrics are as capacitive elements in electronic circuits and as electrical insulation. For these applications, the properties of most concern are the dielectric constant, dielectric loss factor, and dielectric strength. The principal characteristics of a capacitor are that an electric charge can be stored in that capacitor and the magnitude of the charge which can be stored is dependent primarily on the nature of the material, grain size, and the impurity distribution at the grain boundaries.

Scratches are associated with soft materials and in many cases makes an object unacceptable for use. Some of the materials that require an absence of any significant scratch component includes, lenses, photographic films, paper, polymers, metals, metal coated polymers, magnetic recording media and the like. There is a need for forming such protective layers at low temperature in order to take advantage of the many unique substrates in existence.

SUMMARY OF THE INVENTION

It is an object of the present invention to provide a method for forming a dielectric on a substrate, which can be used in many different types of articles.

This object is achieved in a method of forming a dielectric layer on a substrate, comprising the steps of:

(a) providing a metallo-organic material in a solvent, which dissolves such metallo-organic material;
(b) coating dissolved metallo-organic material onto the substrate to form a layer; and
(c) heating the deposited layer in an oxygen environment to produce thermal decomposition of the organic component of the dissolved metallo-organic material and a reaction of the metallic portion of the material with oxygen thereby causing the layer to become dielectric.

The present invention is particularly suitable to provide a dielectric layer for an article and also to provide a scratch resistant layer on metals, alloys, polymers, organics, inorganics, composites, glasses, paper, photographic film, magnetic media, and ceramic substrates.

Another feature of the invention is that the present method can produce articles at a low temperature so that the substrates are not adversely affected by the process of formation of the article.

This invention provides a convenient way to have fully completed solid state reactions to produce desired chemistries in material layer. It is easy to control various crystallographic phases of the material by simplified doping methods.

The method described in this invention is a simple technique for layer deposition with low cost equipment requirements, and permits excellent control of overall stoichiometry, high uniformity of thickness and composition, and ability to coat irregular substrate shapes in a cost effective manner.

A feature of the present invention is that it permits a low temperature process, allowing in-situ processing of temperature sensitive devices and can produce hard and tough layers/films, which have high wear and abrasion resistance.

This invention overcomes many of the problems that are associated with conventional methods of fabricating multi-layer capacitors, flexible capacitors, scratch resistant lenses, capacitors integrated onto circuit boards, and protective coatings on metals, alloys, polymers, organics, inorganics, composites, glasses, paper, photographic film, magnetic media, and ceramic substrates both flexible and rigid in form.

DETAILED DESCRIPTION OF THE PREFERRED EMBODIMENTS

This invention refers to a dielectric layer, which can be used in an article having electrical capacitive properties in which selectively the electrical charges can be tapped or discharged on demand. The present invention has particular applicability in forming an article, which has identified pixels, this is sometimes referred to in the art as pixelization. Since a dielectric material frequently is used to make use of its capacitive properties, articles formed by the present invention can be used in capacitors that can be individually addressed. When addressed such a capacitor can be discharged.

Figure 1:
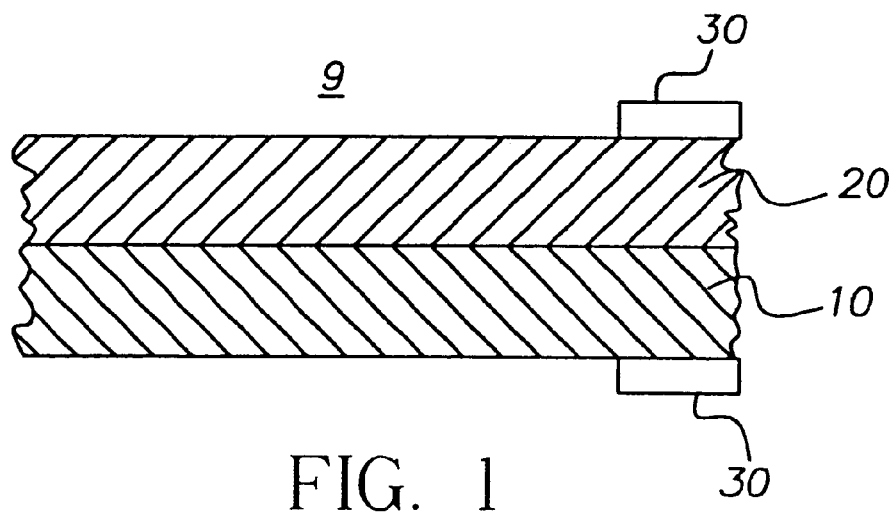
FIG. 1 is a schematic cross-sectional view of the dielectric layer formed on the substrate and having electrodes in accordance with the present invention.

Turning now to FIG. 1, there is shown a cross-sectional view of a capacitor 9, which can be made in accordance with the present invention. The capacitor 9 includes a substrate 10 generally made of a metal or alloy thereof, a dielectric layer 20 made in accordance with the present invention, electrodes 30 are formed on the substrate 10 and the dielectric layer 20 to permit the application or discharge of charge from the dielectric layer 20 as well known in the art.

Figure 2A:
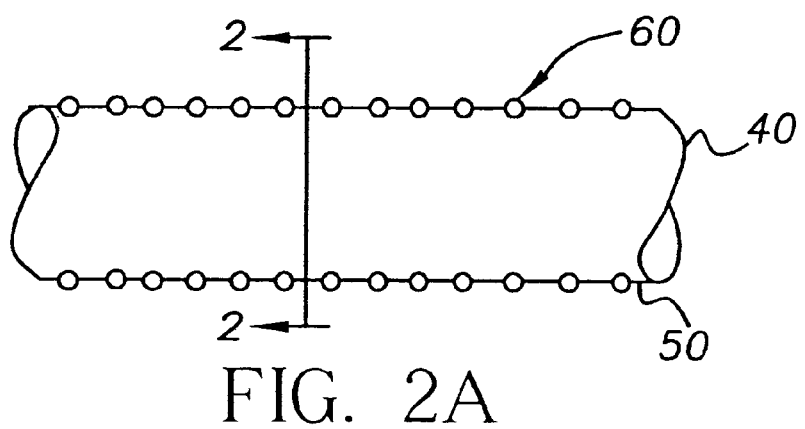
FIG. 2A depicts a front view of a roller, which includes pixels made on dielectric material formed on the surface of such roller.
Figure 2B:
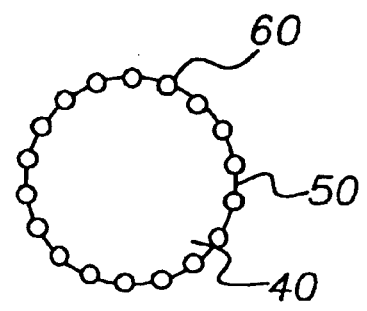
FIG. 2B is a cross-sectional view taken along the lines 2—2 of FIG. 2A.

FIGS. 2A and 2B show in more detail a substrate roller 40 which can for example be a charge carrying roller which is usable in an electrophotographic process for receiving charge on which toner particles are applied. Before the application of such toner particles through a series of electrical connections certain ones of the pixels on the surface of the substrate roller 40 are discharged leaving a charged pattern which corresponds to a latent image. In such an electrophotographic process charge is first applied onto all the pixels on the substrate roller 40. Thereafter certain selected ones of the pixels are discharged in a pattern representing an image. Toner is applied to such charged image pattern to form a toner visual image. The toner visual image is transferred from the substrate roller 40 to a sheet and then fixed to the sheet usually by heat and pressure. Any remaining charge is then removed form the substrate roller 40.

In FIGS. 2A and 2B the substrate roller 40 corresponds to the substrate 10 in FIG. 1. On top of this substrate roller 40 is a dielectric layer 50, which corresponds to the dielectric layer 20 in FIG. 1. As will be described later in this disclosure through the impingement of infrared radiation upon the surface of the dielectric layer 50, conductive portions or pixels can be formed which will receive toner. The formation of the conductive pixels on the surface of the substrate roller 40 is a feature of this invention by selectively discharging certain ones of the pixels a latent image pattern can be formed. Each pixel on the substrate roller 40 is in effect a capacitor which can be used to accept stored charge or discharge stored charge depending on the configuration of the electrical connections.

Capacitors made in accordance with the present invention can have a multi-layer structure in which one of the coatings is electrically conductive and one or more of the other layers are dielectrics that can hold the charge and can be selectively converted to have electrically conductive areas or regions by altering the chemical composition of those regions.

The present invention makes use of ceramic materials, which can be used, in capacitive elements in electronic circuits and as electrical insulation. For these applications, the properties of most concern are the dielectric constant, dielectric loss factor, and dielectric strength. The principal characteristics of a capacitor is that an electric charge can be stored in that capacitor and the magnitude of the charge which can be stored is dependent primarily on the nature of the material, grain size, and the impurity distribution at the grain boundaries. The pixels of FIGS. 2A and 2B can use a ceramic material which has a surface region changed from a dielectric to a conductor by the application of laser light as will described later.

According to the present invention one or more dielectric layers are formed for storing the electrical charges that can utilize any ceramic oxides or any material having a high dielectric constant. A dielectric layer can, for example, be formed on a conductive layer wherein the dielectric layer is formed by the thermal decomposition of an organic component of the dissolved metallo-organic material and a reaction of the metallic portion of the material with oxygen thereby causing the dielectric layer to have charge holding properties. In this invention, aluminum metal extruded tubes were primarily utilized as the conductive material or layer on which the dielectric layer was coated by primarily, adopting MOD, CVD, PVD, Sol-gel, and dip-coating techniques are also preferred techniques for coating dielectric layers on metal, polymers etc.

Oxide ceramics are commonly prepared by solid state reactions and sintering of metal oxide/carbonate mixtures. Because they usually are physical mixtures, they require prolonged grinding/heating cycles to complete the solid state reactions. Sometimes, it is even extremely difficult to have fully completed solid state reactions. This difficulty has led to considerable interests in the preparation of materials by chemical methods for achieving stoichiometric control, "atomic level" homogeneity and for reduction of processing times and temperatures. One of such chemical methods of coating and producing ceramic or other metal or alloy structures, particularly in thick and thin layer form is Metallo-Organic-Decomposition (MOD). Metallo-Organic-Decomposition is a convenient non-vacuum technique for the deposition of various types of inorganic layers. It includes coating a precursor solution (such as, metal carboxylates, metal alkoxides etc.) containing the desired cations in the desired proportions onto a substrate followed by solvent removal and thermal decomposition. MOD is a simple technique for layer deposition with low cost equipment requirements, and permits excellent control of overall stoichiometry, high uniformity of thickness and composition, and ability to coat irregular substrate shapes in a cost effective manner.

Any material with high dielectric constant can be utilized for storage of electric charge, hence capacitor material. In the working example for this invention, only zirconium oxide material is chosen for experimental purposes and cited as examples through which reduction in practice is established.

Three zirconia precursor materials were selected for coating on some rigid electrically conductive material, such as aluminum, on some rigid insulating ceramic materials, such as alumina, and also on some flexible insulating material, such as flexible polyimide polymer substrate. These are: (a) Zirconium 2-Ethylhexanoate, 90% zirconium content (packaged under nitrogen), bought from Gelest, Inc.; (b) Zirconium Octoate (in mineral spirits), 6% zirconium content, bought from Pfaltz & Bauer, Inc.; (c) Zirconium Tetra-n-butoxide (in N-Butanol), 80% zirconium content, bought from Pfaltz & Bauer, Inc. These precursor materials were normally diluted with toluene in 50:50 proportion before coating onto a substrate, because experience showed that undiluted precursors produced very thick layers and because of its thickness those layers had high probability of cracking. The thick and thin films in this invention are sometimes referred to as layers and thin layers are considered to have a thickness less than 1-micron meters. For most of the experiments, spin coating, dip coating, and doctor blade coating were utilized. Dip coating is particularly suitable if the substrate is not a flat surface, such as a camera component.

After coating the substrates with appropriate and suitable method, they were allowed to air dry for about an hour before they were heated at high temperatures in an enriched oxygen environment or air for crystallization of the oxides. In order to obtain thicker crystalline dielectric layers multiple coatings were performed with drying the layers in between.

The MOD and Sol-Gel methods of forming crystalline layers usually allow moderate temperatures, usually around 700 to 800° C. for complete calcination for crystallization. It has been found quite unexpectedly, that a well-developed crystallized zirconia phase was produced at temperatures as low as 300–375° C., which can be coated on a polymer substrate. For example, when a flexible polyimide polymer substrate was used good adhesion between the polymer and the crystalline zirconia layers were obtained at 350° C. A flexible substrate in this invention is defined as a substrate which can be rolled into a cylinder with a minimum diameter of 1 millimeter without damaging the layers coated on the substrate. However, these polymers are known not be stable at around 400° C., and smoothness of the substrate and subsequently that of the crystallized layers were lost at around 380° C. Yet another surprising result was found for coatings on metallic and ceramic substrates. Not only was crystallized zirconia phase observed, excellent adhesion of crystallized zirconia layers was achieved at 500–630° C., preferably at 550° C. For a substrate such as aluminum or aluminum alloys, 630° C. is the upper limit of thermal processing due to the softening of such substrates of this type at higher temperatures. An additional advantage of low temperature thermal processing of these dielectric coatings is smaller grain size which allows for grain sliding and movement, hence reduced cracking in the crystallized dielectric layer and thus making it more flexible. The schematics of this dielectric structure are shown in FIG. 1, wherein substrate 10 is coated with MOD precursor and heated in air to form dielectric layer 20. The highly electrically conductive materials such as Au, Ag, Pd, Au—Pd alloy electrodes 30 are formed on both dielectric layer 20 and substrate 10.

Converting certain thickness of the dielectric zirconia layer to an electrically conductive layer were done adopting method used by Ghosh, et. al in commonly assigned U.S. Pat. No. 5,889,234, the disclosure of which is incorporated by reference herein. A dielectric member with an integral, electrically conductive surface is made by modifying the chemical composition of either the whole surface or on some selected areas, such as pixels of the surface using infrared laser energy. Through the impingement of infrared laser radiation upon the surface of the ceramic substrate, an electrically conductive region is produced on the surface of the substrate. In such manner, the entire surface can be made electrically conductive or a particular pattern can be traced. A Nd—YAG laser with a wavelength of 1.06-micron meter was utilized. As an integral part of the substrate, the surface will not delaminate from the substrate. Further, because the modified surface region and the substrate are both a zirconia, the coefficients of thermal expansion of the substrate and the modified surface region will be closely matched. These types of laser assisted chemical changes were made on zirconia or its composites coated on electrically conductive metallic and electrically non-conductive polymeric or plastic substrates as described above. This type of multilayer structure forms the basis for pixalization as described earlier. In the case of flexible polyimide polymer substrate the surface opposite to the laser treated electrically conductive surface was coated with some conductive metallic or alloy layers by PVD, CVD, Sol-Gel and, and dip-coating methods. Suitable electrodes were configured so that the novel capacitor is effective. The configuration described above is shown in FIG. 2, wherein the conductive substrate is represented as a substrate roller 40 made of Al or its alloys. As shown in FIGS. 2A and 2B the conductive substrate can be in the form of a roller which is coated with MOD precursor and heated in air to form the dielectric layer 50, which in this case can be zirconia. A zirconia layer can be treated with a Nd—YAG laser to form conductive pixel area 60.

This invention can be used in articles having a dielectric layer on a very thin metal, polymer, inorganic, organic, composite or ceramic substrate which is electrically conductive or on non-conductive flexible material layer where areas can be filly or selectively converted to have electrically conductive areas or regions by altering the chemical composition of those regions, thus forming a flexible capacitor.

This invention also provides an article having the property of a scratch resistant layer on metals, alloys, polymers, organics, inorganics, composites, glasses, paper, photographic film, magnetic media, and ceramic substrates.

This invention also provides a method of fabricating the above mentioned articles at a low temperature so that the substrates are not adversely affected by the process of formation of the article.

The above described precursor materials for formation of zirconia layer were doped with a precursor, which translated to yttria, a crystal modifying dopant. The doping was done through Y-Acetylacetonate. The amount of dopant controls the crystalline phase, and for example, an appropriate amount of dopant to produce 0, 9, 30 mole % yttria were added and thoroughly mixed with Zirconium 2-Ethylhexanoate, Zirconium Octoate, and Zirconium Tetra-n-butoxide, before they were coated on the substrates.

Characterization of the phases generated using the processes described in this invention was carried out using X-ray diffraction techniques. Data were collected using a Rigaku Bragg-Brentano diffractometer with a copper anode in coupled or glancing angle geometries. In coupled geometry the incident X-ray beam impinges upon the sample at an angle theta and the diffracted X-ray beam is scattered at an angle theta. In glancing angle geometry the incident beam impinges upon the sample at a shallow angle (less than 5°) and the diffracted X-rays scatter off the sample at an angle theta. Phase identification was carried out by comparing the X-ray diffraction patterns with reference files contained in the Powder Diffraction File (International Centre for Diffraction Data, 12 Campus Boulevard, Newtown Square, Pa. 19073-3273, USA). Quantitative analysis of zirconia phase ratios was performed using the method of Garvie and Nicholson [R. C. Garvie and P. S. Nicholson, J. Amer. Cer. Soc., 55(6) (1972) 303].

The weight percent of monoclinic $ZrO_2$ is calculated using the equation:

$$X=\{I_m(111)+I_m(11\bar{1})\}/\{I_h(111)+I_m(111)+I_m(11\bar{1})\} \quad (1)$$

Where X is the weight percent of monoclinic $ZrO_2$, and $I_m(hkl)$ and $I_h(hkl)$ are the integrated intensities of the hkl peaks of the monoclinic and tetragonal/cubic $ZrO_2$ phases respectively.

The crystallite size of undoped and yttria-doped tetragonal zirconia was measured using the Scherrer method [B. D. Cullity, Elements of X-ray Diffraction $2^{nd}$ ed., Addison-Wesley Publishing Company, Inc., (1978), 102].

The crystallite size is calculated using the equation:

$$t=\{0.9\lambda\}/\{B \cos \theta_B\}$$

Where t is the crystallite size in angstroms (Å), $\lambda$ is the wavelength of the diffracted X-ray beam, B is the diffraction peak full-width at half maximum in radians, and $\theta_B$ is the X-ray diffraction peak Bragg angle.

Figure 3:
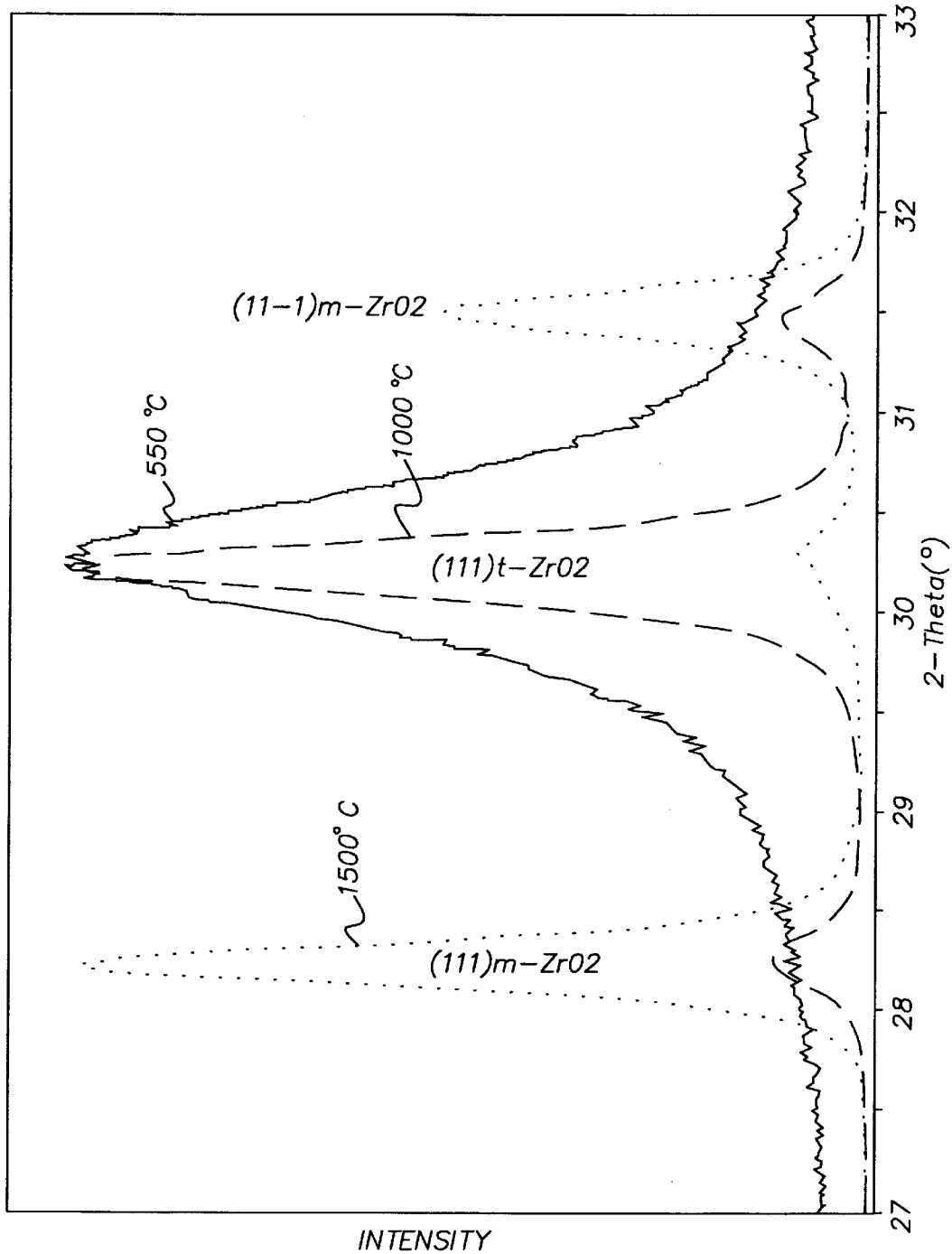
FIG. 3 is a graph showing intensity versus Bragg diffraction angle ($2\theta°$) showing a comparison of coupled X-ray diffraction patterns for Zr-2-Ethylhexanoate coated onto an alumina substrate thermally processed at various temperatures.

The diffraction patterns shown in FIG. 3 show that the Zr-2-Ethylhexanoate coating on an alumina substrate crystallizes upon thermal processing. At 550° C. tetragonal zirconia (t-$ZrO_2$) is the only phase detected that is due to the coating. At 1000° C. t-$ZrO_2$ and monoclinic zirconia (m-$ZrO_2$) are both detected with t-$ZrO_2$ being the major component. At 1500° C. t-$ZrO_2$ and m-$ZrO_2$ are both detected with m-$ZrO_2$ being the major component. The X-ray diffraction peak widths decrease with increasing processing temperature as a result of crystallite size growth.

Figure 4:
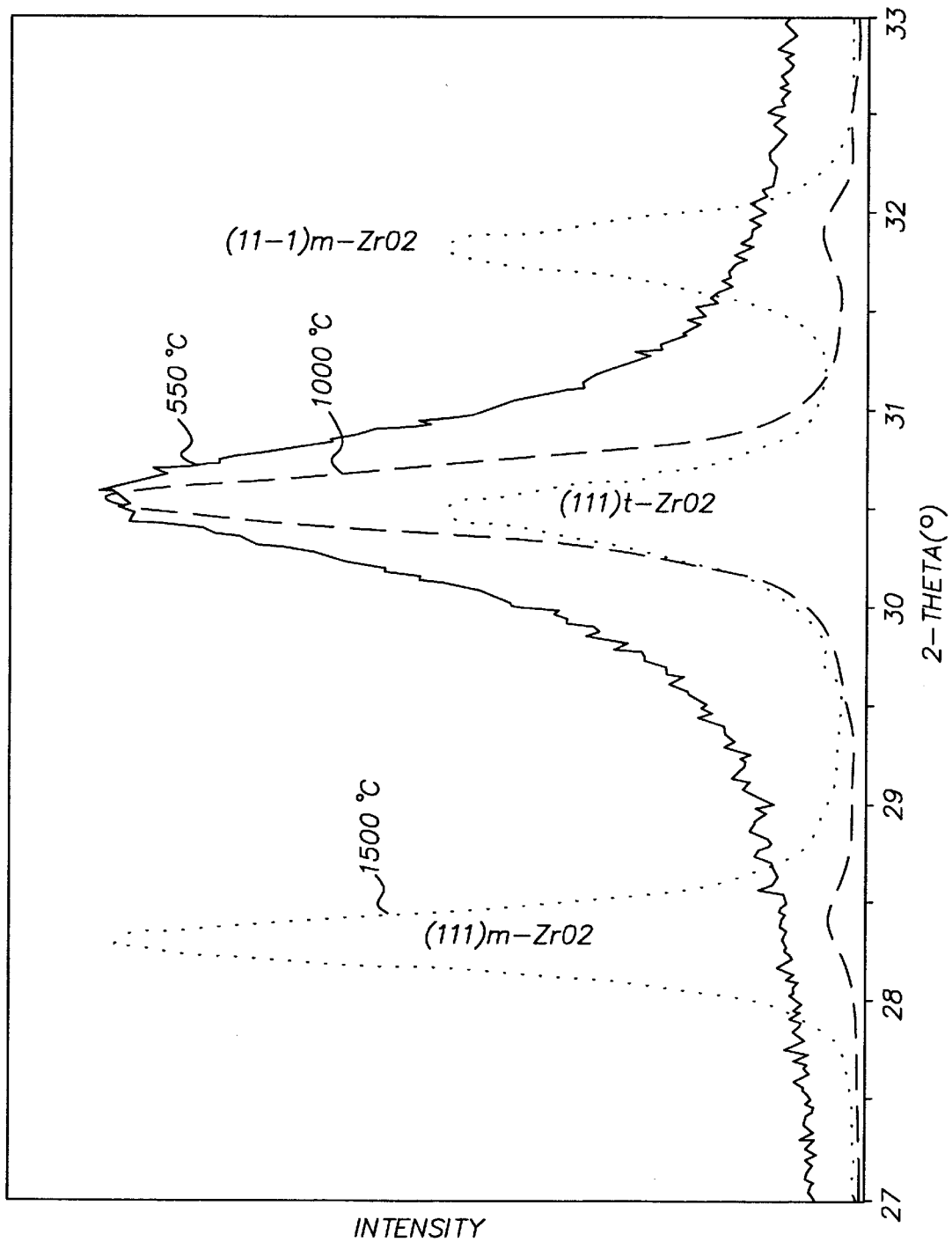
FIG. 4 is a graph showing intensity versus Bragg diffraction angle ($2\theta°$) showing a comparison of coupled X-ray diffraction patterns for Zr-2-Ethylhexanoate doped with Y-Acetylacetonate at a ratio of Zr/Y of 91/9 coated onto an alumina substrate thermally processed at various temperatures.

The diffraction patterns shown in FIG. 4 show that the Zr-2-Ethylhexanoate/Y-Acetylacetonate 91/9 coating on an alumina substrate crystallizes upon thermal processing. At 550° C. tetragonal zirconia (t-$ZrO_2$) is the only phase detected that is due to the coating. At 1000° C. t-$ZrO_2$ and monoclinic zirconia (m-$ZrO_2$) are both detected with t-$ZrO_2$ being the major component. At 1500° C. t-$ZrO_2$ and m-$ZrO_2$ are both detected with m-$ZrO_2$ being the major component. The X-ray diffraction peak widths decrease with increasing processing temperature as a result of crystallite size growth.

Figure 5:
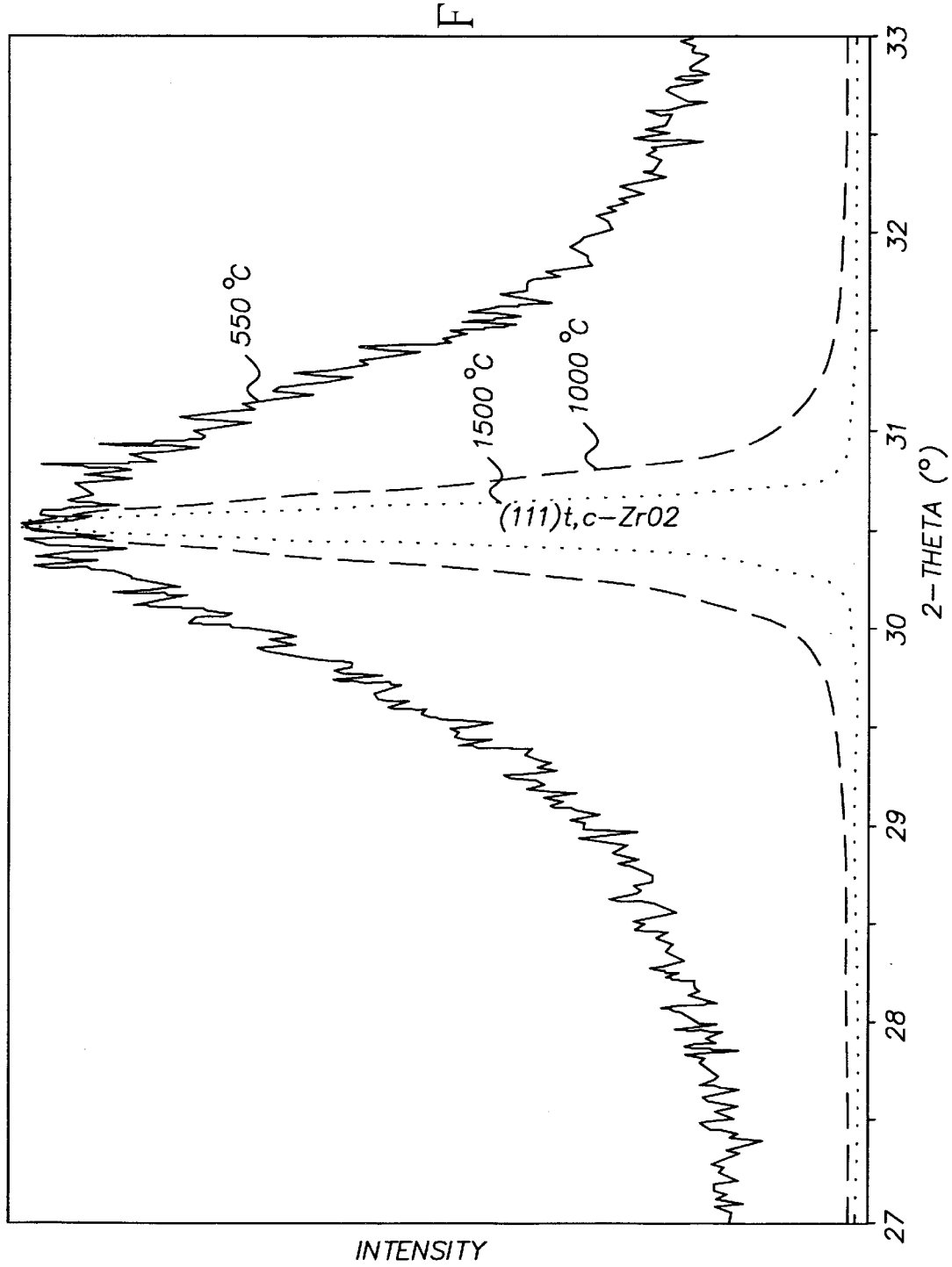
FIG. 5 is a graph showing intensity versus Bragg diffraction angle ($2\theta°$) showing a comparison of coupled X-ray diffraction patterns for Zr-2-Ethylhexanoate doped with Y-Acetylacetonate at a ratio of Zr/Y of 70/30 coated onto an alumina substrate thermally processed at various temperatures.

The diffraction patterns shown in FIG. 5 show that the Zr-2-Ethylhexanoate/Y-Acetylacetonate 70/30 coating on an alumina substrate crystallizes upon thermal processing. At 550° C. tetragonal zirconia (t-$ZrO_2$) is the only phase detected that is due to the coating. At 1000° C. t-$ZrO_2$ is the only phase detected. At 1500° C. cubic zirconia (c-$ZrO_2$) is the only phase detected. The X-ray diffraction peak widths decrease with increasing processing temperature as a result of crystallite size growth.

The calculated weight percents of m-$ZrO_2$ of the zirconia phases in the layers described in FIGS. 3–5 are listed below in Table 1.

TABLE 1

Weight percent monoclinic $ZrO_2$ as a function of Zr/Y composition and processing temperature

|  | 550° C. | 1000° C. | 1500° C. |
|---|---|---|---|
| Zr/Y 100/0 | 0 | 19 | 85 |
| Zr/Y 91/9 | 0 | 14 | 67 |
| Zr/Y 70/30 | 0 | 0 | 0 |

The results described in FIGS. 3–5 and shown in Table 1 are unexpected. The phase diagram for zirconia indicates that undoped zirconia exists only as the monoclinic polymorph at room temperature up to 1200° C. Generation of undoped tetragonal zirconia at 550° C. does not follow the phase diagram. The method of tetragonal zirconia formation practiced in this invention allows for low-temperature generation as opposed to conventional processing methods that require much higher temperatures for processing.

The calculated crystallite sizes of the tetragonal zirconia phases generated at 550° C. in the layers described in FIGS. 3–5 are listed below in Table 2.

TABLE 2

Crystallite size of t-$ZrO_2$ as a function of Zr/Y composition, processing temperature of 550° C.

| Sample | Crystallite size (Å) |
|---|---|
| 100/0 Zr/Y | 124 |
| 91/9 Zr/Y | 116 |
| 70/30 Zr/Y | 54 |

The results shown in Table 2 are unanticipated. Doping of $ZrO_2$ is intended to stabilize the t-$ZrO_2$ phase but is not utilized as a crystallite size modifier. By fabricating zirconia coatings with small crystallites, the flexibility of the zirconia coating is enhanced.

Figure 6:
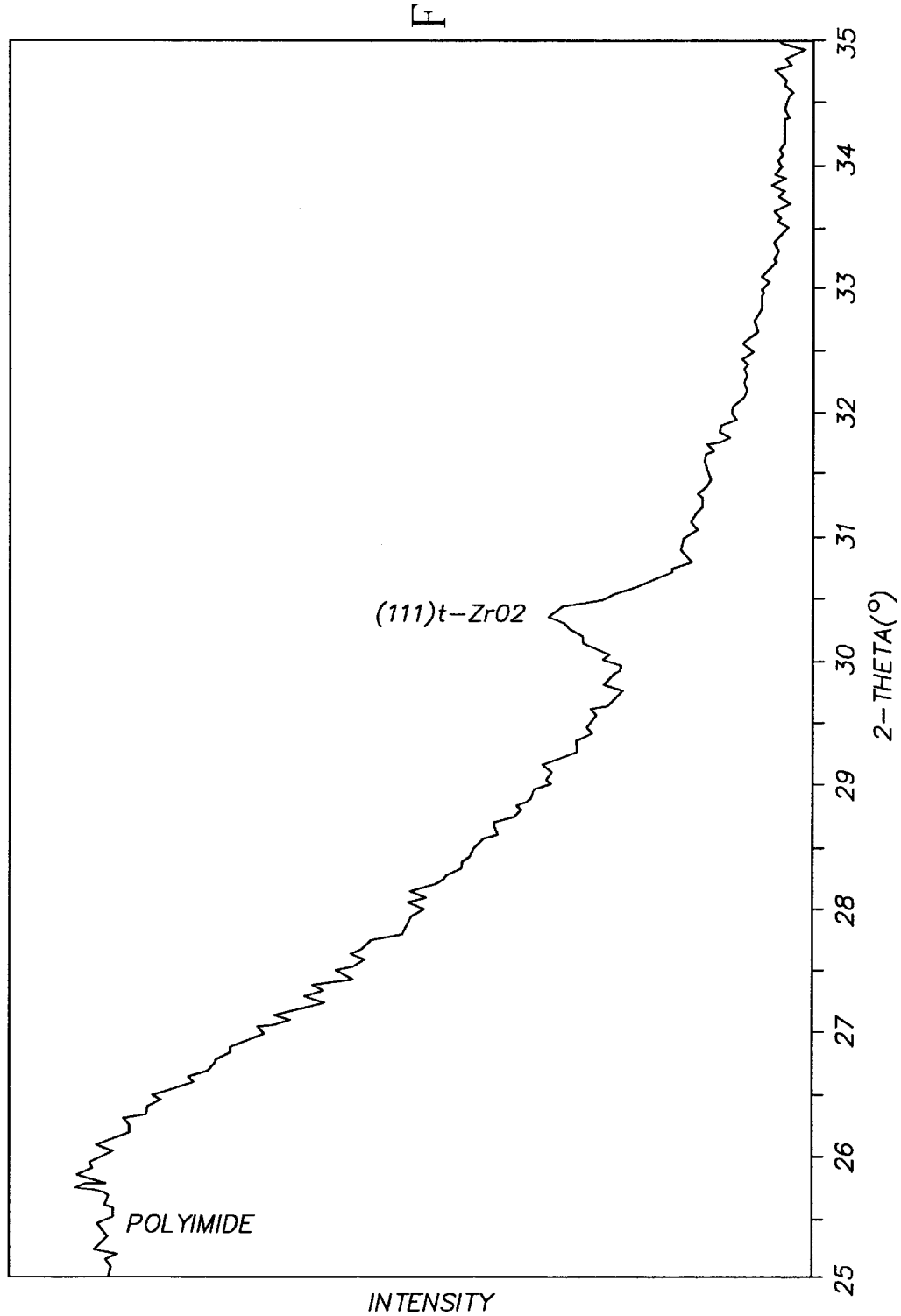
FIG. 6 is a graph showing intensity versus Bragg diffraction angle (2θ°) showing a glancing angle X-ray diffraction pattern for Zr-2-Ethylhexanoate coated onto a flexible polyimide polymer substrate thermally processed at 350° C.

The diffraction pattern in FIG. 6 shows that the Zr-2-Ethylhexanoate coating on flexible polyimide polymer substrate crystallizes upon thermal processing. At 350° C. tetragonal zirconia (t-$ZrO_2$) is the only phase detected that is due to the coating.

A surprising result is that the method described herein allows for generation of t-ZrO2 onto substrates, for example polymer or paper substrates, which cannot be processed at extreme thermal conditions.

Figure 7:
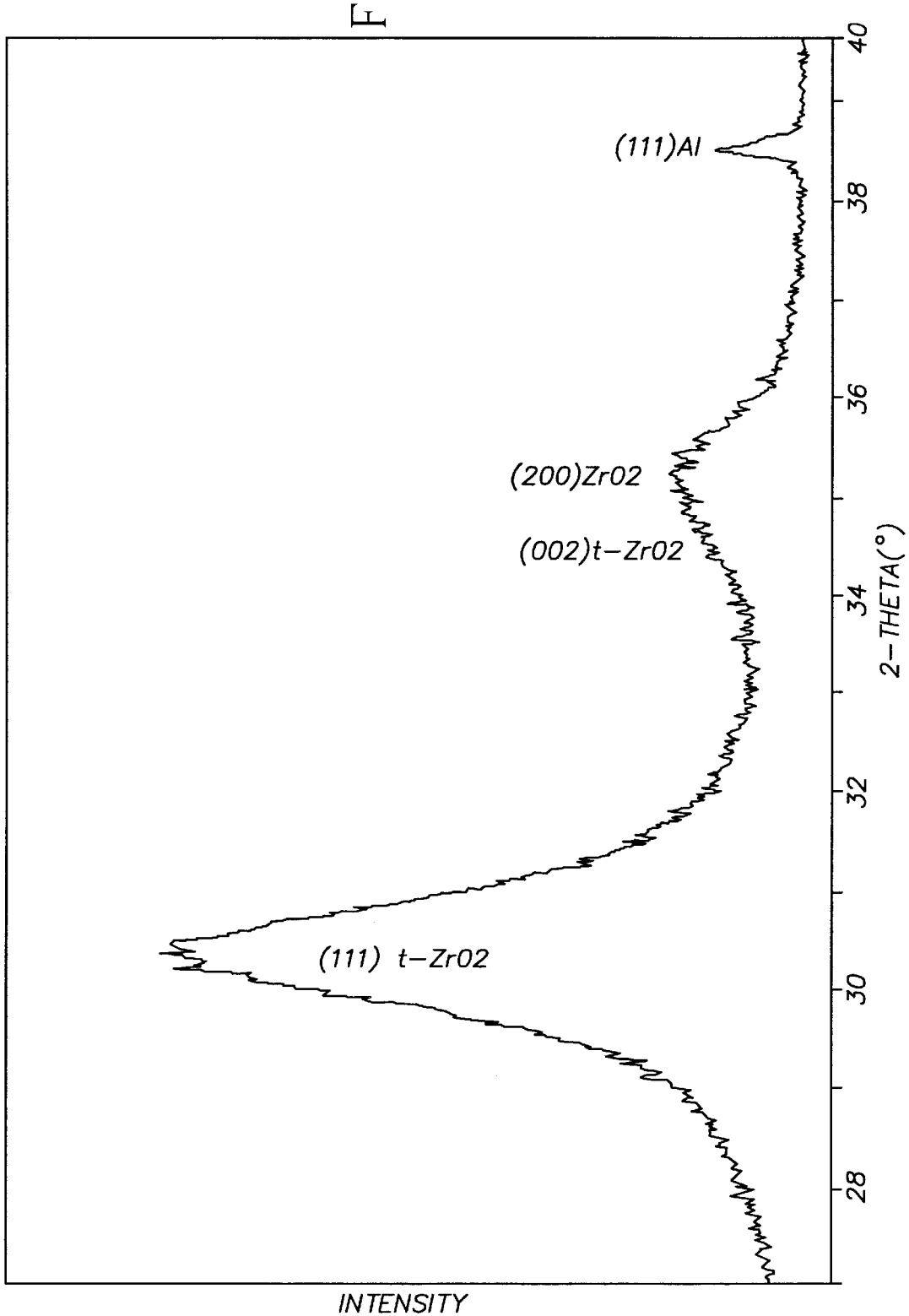
FIG. 7 is a graph showing intensity versus Bragg diffraction angle (2θ°) showing a coupled X-ray diffraction pattern for Zr-2-Ethylhexanoate coated onto an aluminum metal substrate thermally processed at 550° C.

The diffraction pattern in FIG. 7 shows that the Zr-2-Ethylhexanoate coating on an aluminum metal substrate crystallizes upon thermal processing. At 550° C. tetragonal zirconia (t-$ZrO_2$) is the only phase detected that is due to the coating.

The above-referenced unexpected result is advantageous since it allows for generation of t-$ZrO_2$ onto metal substrates, for example aluminum, copper, silver, antimony and alloys, which cannot be processed at extreme thermal conditions.

The invention has been described in detail with particular reference to preferred embodiments thereof, but it will be understood that variations and modifications can be effected within the spirit and scope of the invention.

Parts List 9 capacitor
10 substrate
20 dielectric layer
30 electrodes
40 substrate roller
50 dielectric layer
60 conductive pixel area

What is claimed is:

1. A method of forming a dielectric layer on a substrate including aluminum or aluminum alloys, comprising the steps of:
 (a) providing a metallo-organic material including Zirconium 2-Ethylhexanoate, Zirconium Octoate or Zirconium Tetra-n-butoxide, in a solvent without a dopant, such solvent dissolving such metallo-organic material;
 (b) coating dissolved metallo-organic material onto the substrate to form a layer; and
 (c) heating in a range of 300 to 630° C. the deposited layer in an oxygen environment to produce thermal decomposition of the organic component of the dissolved metallo-organic material and a reaction of the metallic portion of the material with oxygen to produce crystalline tetragonal phase zirconia.

2. The method of claim 1 wherein the temperature range is 500 to 630° C.

3. A method of forming a dielectric layer on a polymer substrate, comprising the steps of:

(a) providing a metallo-organic material including Zirconium 2-Ethylhexanoate, Zirconium Octoate or Zirconium Tetra-n-butoxide, in a solvent without a dopant, such solvent dissolving such metallo-organic material;

(b) coating dissolved metallo-organic material onto the substrate to form a layer; and (c) heating in a range of 300 to 375° C. the deposited layer in an oxygen environment to produce thermal decomposition of the organic component of the dissolved metallo-organic material and a reaction of the metallic portion of the material with oxygen to produce crystalline tetragonal phase zirconia.

4. The method of claim 3 wherein the polymer is a polyimide.

* * * * *